United States Patent
Du et al.

(10) Patent No.: US 8,226,181 B2
(45) Date of Patent: Jul. 24, 2012

(54) SLIDE RAIL STRUCTURE

(75) Inventors: Lian-Chang Du, Shanghai (CN);
Shou-Jen Yang, Taipei (TW)

(73) Assignee: Inventec Corporation, Taipei (TW)

( * ) Notice: Subject to any disclaimer, the term of this patent is extended or adjusted under 35 U.S.C. 154(b) by 436 days.

(21) Appl. No.: 12/273,290

(22) Filed: Nov. 18, 2008

(65) Prior Publication Data
US 2010/0032389 A1 Feb. 11, 2010

(30) Foreign Application Priority Data
Aug. 8, 2008 (CN) .......................... 2008 1 0145471

(51) Int. Cl.
*A47B 88/04* (2006.01)
*A47B 88/16* (2006.01)
*H05K 7/14* (2006.01)

(52) U.S. Cl. .................... 312/334.4; 312/334.1; 211/26; 361/727

(58) Field of Classification Search ............... 312/223.1, 312/334.1, 334.7, 334.8, 265.1–265.4, 333, 312/334.44, 334.5, 334.4, 330.1, 334.13; 361/727, 725, 679.01–679.61, 724, 726; 384/22; 211/26, 192; 248/424, 429, 298.1
See application file for complete search history.

(56) References Cited

U.S. PATENT DOCUMENTS

| | | | | |
|---|---|---|---|---|
| 4,988,214 A * | 1/1991 | Clement | ......................... | 384/18 |
| 5,571,256 A * | 11/1996 | Good et al. | ...................... | 211/26 |
| 6,033,047 A * | 3/2000 | Hoffman | ................. | 312/334.44 |
| 6,424,534 B1 * | 7/2002 | Mayer et al. | ................... | 361/724 |
| 6,442,030 B1 * | 8/2002 | Mammoser et al. | .......... | 361/727 |
| 6,457,790 B1 * | 10/2002 | Liang et al. | .............. | 312/334.46 |
| 6,460,954 B1 * | 10/2002 | Bayani et al. | ............ | 312/334.44 |
| 6,502,910 B2 * | 1/2003 | Kuo-Chan | ..................... | 312/333 |
| 6,685,033 B1 * | 2/2004 | Baddour et al. | ................ | 211/26 |
| 6,830,300 B2 * | 12/2004 | Lauchner | ................... | 312/334.5 |
| 6,948,691 B2 * | 9/2005 | Brock et al. | ............. | 248/222.13 |
| 6,962,397 B2 * | 11/2005 | Dobler et al. | ................. | 312/333 |
| 7,159,958 B1 * | 1/2007 | Lu | ............................. | 312/334.44 |
| 7,187,554 B2 * | 3/2007 | Seki et al. | ..................... | 361/727 |
| 7,364,244 B2 * | 4/2008 | Sandoval | ...................... | 312/333 |
| 7,405,926 B2 * | 7/2008 | Wu et al. | .................. | 361/679.27 |

(Continued)

FOREIGN PATENT DOCUMENTS

CN 101025644 8/2007

OTHER PUBLICATIONS

Chinese First Examination Report of China Application No. 200810145471.6, dated on Jan. 31, 2011.

*Primary Examiner* — James O Hansen
*Assistant Examiner* — Sasha T Varghese
(74) *Attorney, Agent, or Firm* — J.C. Patents

(57) ABSTRACT

A slide rail structure is provided. The slide rail structure is disposed between a computer case and a rack, and includes a first slide rail and a second slide rail. The first slide rail is fixed to the rack. The second slide rail has a first end, a second end and a carrying part. The second slide rail is fixed to the rack via the first end, and is connected to the first slide rail via the second end. The carrying part contacts a bottom plate of the computer case for sliding the computer case on the carrying part.

8 Claims, 4 Drawing Sheets

U.S. PATENT DOCUMENTS

| | | | |
|---|---|---|---|
| 7,848,110 B2 * | 12/2010 | Du et al. | 361/727 |
| 2002/0093795 A1 * | 7/2002 | Gough et al. | 361/727 |
| 2002/0158556 A1 * | 10/2002 | Cheng | 312/333 |
| 2003/0106864 A1 * | 6/2003 | Kaminski | 211/26 |
| 2003/0161114 A1 * | 8/2003 | Berry et al. | 361/727 |
| 2004/0020874 A1 * | 2/2004 | Haney | 211/26 |
| 2004/0252465 A1 * | 12/2004 | Hartman | 361/726 |
| 2005/0274680 A1 * | 12/2005 | Allen et al. | 211/26 |
| 2007/0018547 A1 * | 1/2007 | Yang et al. | 312/333 |
| 2007/0114895 A1 * | 5/2007 | Chen et al. | 312/333 |
| 2007/0195496 A1 * | 8/2007 | Wu et al. | 361/683 |
| 2007/0284981 A1 * | 12/2007 | Cheng | 312/334.1 |
| 2008/0036347 A1 * | 2/2008 | Liang | 312/334.5 |
| 2008/0217497 A1 * | 9/2008 | Yang et al. | 248/298.1 |

* cited by examiner

SLIDE RAIL STRUCTURE

CROSS-REFERENCE TO RELATED APPLICATION

This application claims the priority benefit of P.R.C. patent application serial no. 200810145471.6, filed on Aug. 8, 2008. The entirety of the above-mentioned patent application is hereby incorporated by reference herein and made a part of the specification.

BACKGROUND OF THE INVENTION

1. Field of the Invention

The present invention relates to a slide rail structure. More particularly, the present invention relates to a slide rail structure of a computer appliance.

2. Description of Related Art

Generally, computers are grouped into personal computers, servers and super computers according to application degrees thereof. The personal computer generally applies one or two processors for processing administrative business of a general enterprise or multimedia related information. If complicated works or large amounts of data are required to be processed, the server is generally applied, in which the server having two to four processors, even eight to sixteen processors can be selected according to a current network requirement. As to applications of super calculations, the super computer having dozens or hundreds, even thousands of serially connected processors is generally applied.

The commonly used servers are generally rack mount computers that can be stacked and serially connected. According to such design, sizes of motherboards of the computers are greatly reduced, and a central processor, a chip set, memories and a hard disk are disposed in each of the computers. Then, the computers are slid into a rack via guiding of slide rails, so as to save spaces and facilitate swapping of the computers. Each of the servers is actually an independent and removable computer, which has been evolved to a rack mount server having features of thin and slim appearance, low occupation space, low power consumption and easy manageability.

General slide rail structures applied to the rack are disposed at both sides of the computer in a pair, which can support a weight of the computer, by which the computer can be pulled out from the rack or pushed back to the rack, horizontally. Furthermore, a general slide rail structure includes an outer slide rail and an inner slide rail, so that the computer can be slid relative to the rack via coordination of the inner and outer slide rails.

However, the inner slide rail has to be assembled to the side of the computer first. Then, with coordination of the outer slide rail on the rack, the computer can be slid relative to the rack. Namely, a width between the computer and the rack has to be great enough for simultaneously accommodating the inner and outer slide rails, so as to facilitate assembling the slide rails and the computer. Therefore, if the computer having a relatively great width is assembled to the rack, it probably cannot be installed due to excessive widths of the inner and outer slide rails.

SUMMARY OF THE INVENTION

The present invention is directed to a slide rail structure, which has a relatively small configuration space.

The present invention provides a slide rail structure disposed between a computer case and a rack. The slide rail structure includes a first slide rail and a second slide rail. The first slide rail is fixed to the rack. The second slide rail has a first end, a second end and a carrying part. The second slide rail is fixed to the rack via the first end, and is connected to the first slide rail via the second end. The carrying part contacts a bottom plate of the computer case for sliding the computer case on the carrying part.

In an embodiment of the present invention, the slide rail structure further includes a third slide rail and a supporting member. The third slide rail is located in the second slide rail and fixed to the second slide rail. The third slide rail has a rail part. The supporting member is fixed to the computer case and is slidably disposed on the rail part.

In an embodiment of the present invention, the supporting member is located at a position rear to a gravity center of the computer case.

In an embodiment of the present invention, the supporting member is located at rear of the computer case.

In an embodiment of the present invention, the rail part is parallel to the carrying part.

In an embodiment of the present invention, the supporting member has a supporting part located between the rail part and the carrying part and contacting the rail part.

In an embodiment of the present invention, when the computer case is totally installed in the rack, the supporting part is located at an end of the rail part.

In an embodiment of the present invention, the slide rail structure further includes a holder fixed to the rack and the first end of the second slide rail, so as to fix the second slide rail to the rack via the holder.

In an embodiment of the present invention, the slide rail structure further includes a blocking member fixed to the first slide rail, which is used for limiting movement of the computer case towards the interior of the rack.

In an embodiment of the present invention, the slide rail structure further includes a plurality of fixing members. The first slide rail has a slide groove, and the fixing members are respectively penetrated through the slide groove and fixed to the second slide rail.

In an embodiment of the present invention, the second slide rail is slidably disposed in the first slide rail via the second end.

In the slide rail structure of the present invention, the carrying part of the second slide rail carries the computer case, and the computer case can be slid on the carrying part, so that assembling a slide rail on the computer case is unnecessary. Therefore, a space between the computer case and the rack, which is originally used for assembling the slide rail to the computer case can be saved. Thus, the slide rail structure of the present invention can be allocated to a space with a relatively small width. Moreover, in the slide rail structure of the present invention, the rail part of the third slide rail is interfered with the supporting member on the computer case. Therefore, turnover of the computer case can be avoided.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
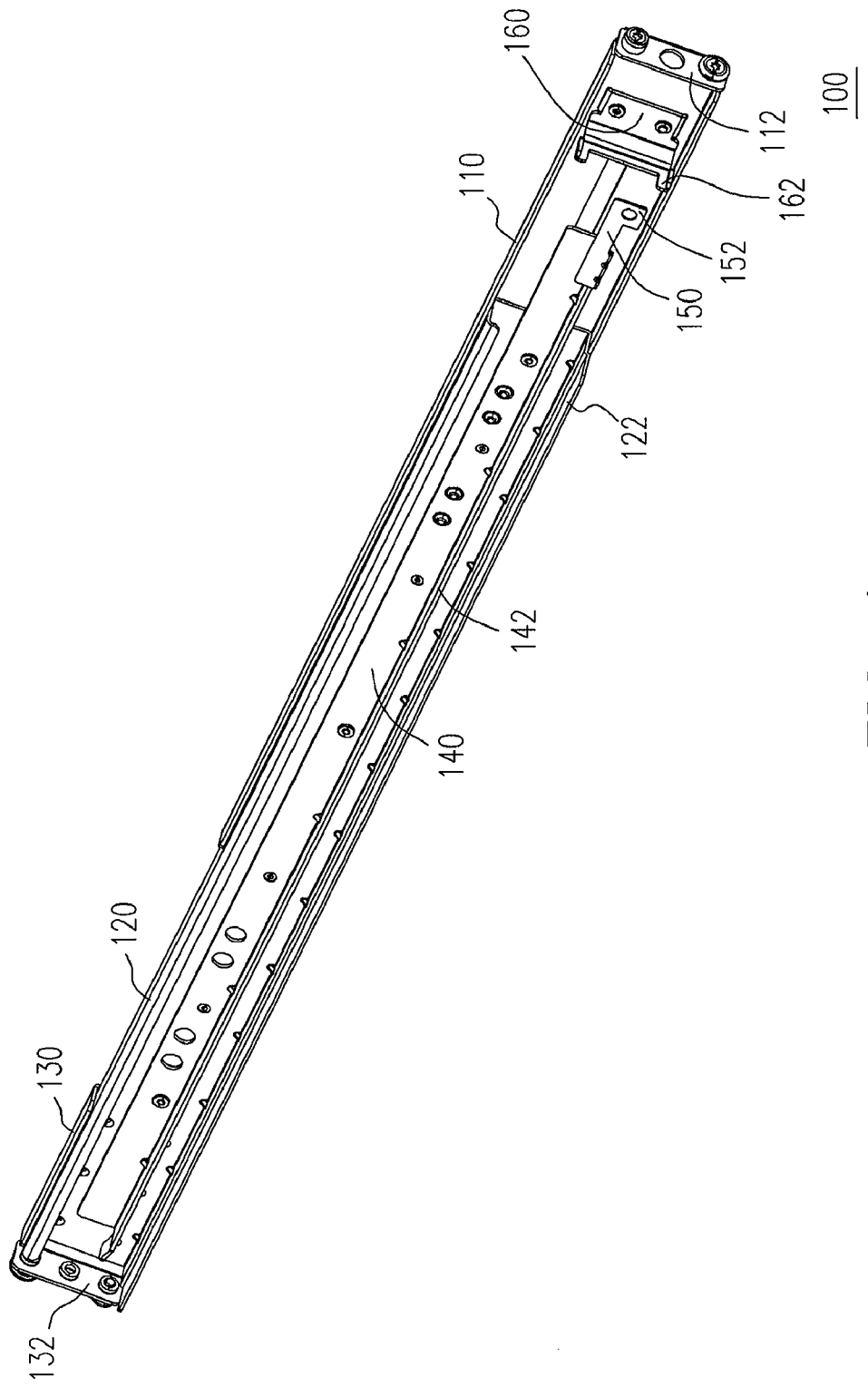
FIG. 1 is a schematic diagram of a slide rail structure according to an embodiment of the present invention.
Figure 2:
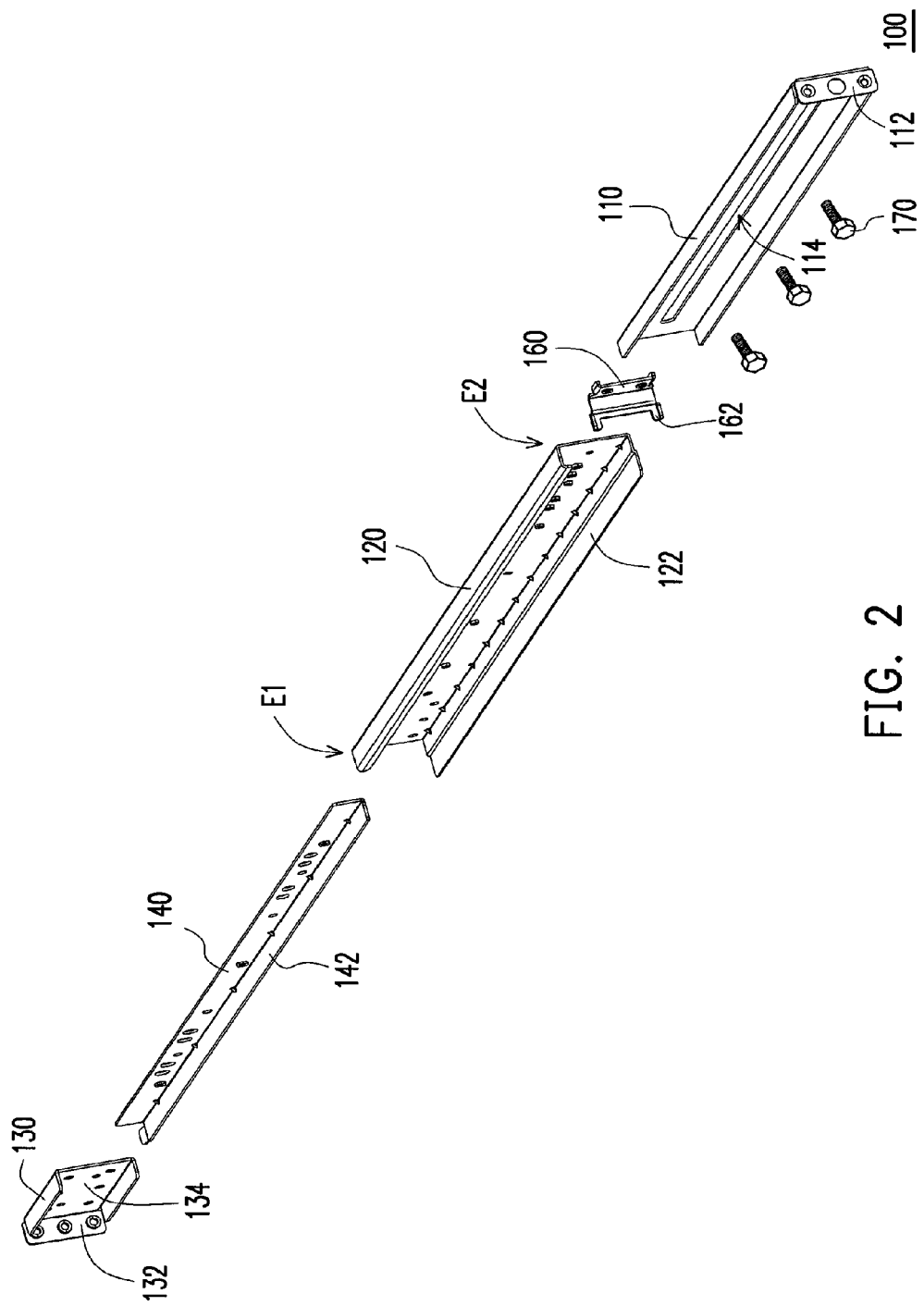
FIG. 2 is an exploded view of FIG. 1.
Figure 4:
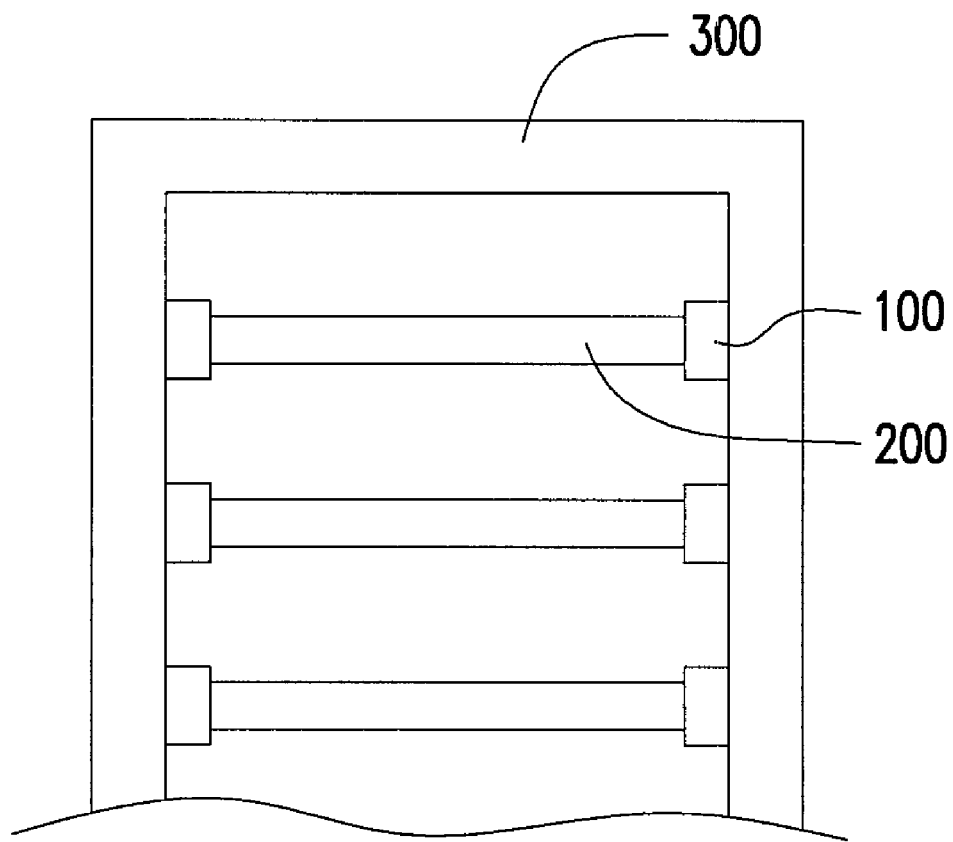
FIG. 4 is a schematic view showing the relationship between a computer case, a rack, and the slide rail structure.

FIG. 1 is a schematic diagram of a slide rail structure according to an embodiment of the present invention. FIG. 2 is an exploded view of FIG. 1. Referring to FIG. 1, FIG. 2, and FIG. 4, the slide rail structure 100 is disposed between a computer case 200 and a rack 300. The slide rail structure 100 includes a first slide rail 110 and a second slide rail 120. In the present embodiment, the second slide rail 120 is nested in the first slide rail 110. Though in the present embodiment, only a single slide rail structure 100 is described, in an actual application, the slide rail structure 100 can be disposed at both sides of the computer case 200 and the rack 300 in a pair, and a length between two sides of the rack 300 is a width of the rack 300.

The first slide rail 110 is fixed to the rack 300. For example, the first slide rail 110 has a fixing part 112, and the fixing part 112 is fixed to a rear end of the rack 300. The second slide rail 120 has a first end E1, a second end E2 and a carrying part 122. The first end E1 of the second slide rail 120 is fixed to a front end of the rack 300. In the present embodiment, the slide rail structure further includes a holder 130 having a first fixing part 132 and a second fixing part 134. The holder 130 is fixed to the rack 300 via the first fixing part 132, and is fixed to the first end E1 of the second slide rail 120 via the second fixing part 134, so that the second slide rail 120 can be fixed to the rack 300 via the holder 130.

Moreover, the second slide rail 120 is connected to the first slide rail 110 via the second end E2. Before the first slide rail 110 and the second slide rail 120 are assembled to the rack 300, the second slide rail 120 can be slidingly disposed to the first slide rail 110 via the second end E2 for being adjusted to match a distance between the rear and front ends of the rack 300. Thus, the slide rails can be more conveniently fixed to the rack 300. In the present embodiment, the slide rail structure 100 further includes a plurality of fixing members 170, for example, screws. The first slide rail 110 further has a slide groove 114, and the fixing members 170 are respectively penetrated through the slide groove 114 and fixed to the second slide rail 120. When the second slide rail 120 slides relative to the first slide rail 110, the fixing members 170 correspondingly slide within the slide groove 114.

The carrying part 122 is contacted to a bottom plate (not shown) of the computer case 200 for carrying the computer case 200, by which the computer case 200 can be slid on the carrying part 122. It should be noted that since the carrying part 122 of the second slide rail 120 carries the computer case 200, and the computer case 200 can be slid on the carrying part 122, assembling a slide rail on the computer case 200 is unnecessary. Therefore, the assembly is relatively easy, and a space originally used for assembling the slide rail to the computer case 200 can be saved. Namely, for the rack of a same width, a wider computer case can also be installed due to the space saved by the slide rail structure 100.

Figure 3:
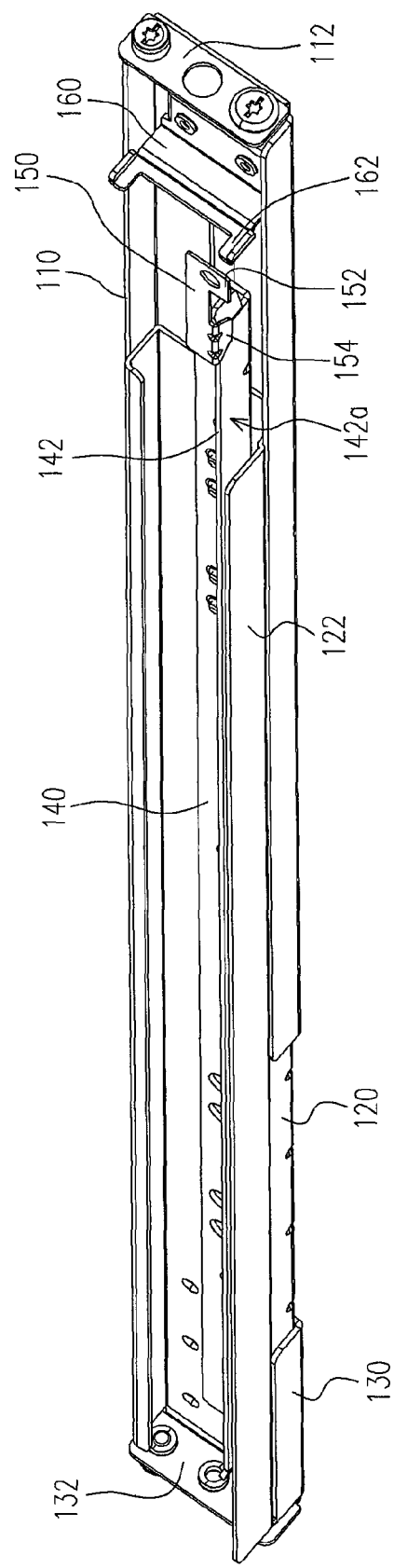
FIG. 3 is another angle of view of FIG. 1.

FIG. 3 is another angle of view of FIG. 1. Referring to FIG. 1 and FIG. 3, in the present embodiment, the slide rail structure 100 further includes a third slide rail 140 and a supporting member 150 (which is not illustrated in FIG. 1). The third slide rail 140 is located in the second slide rail 120 and fixed to the second slide rail 120. The third slide rail 140 has a rail part 142. The supporting member 140 is fixed to the computer case 200, and is slidably disposed to the rail part 142. For example, the supporting member 150 has a fixing part 152, and the supporting member 150 is fixed to an inner side of a side plate of the computer case 200 via the fixing part 152. The supporting member 150 is located at a position rear to a gravity center of the computer case 200. In the present embodiment, the supporting member 150 is located at the rear end of the computer case 200.

Moreover, the supporting member 150 further has a supporting part 154 located between the rail part 142 and the carrying part 122, and contacted to a bottom surface 142a of the rail part 142. In addition, the supporting part 154 can be protruded out the side plate (not shown) from an opening (not shown) on the side plate of the computer case 200, so as to contact the rail part 142 located outside the side plate. In the present embodiment, the rail part 142 and the carrying part 122 are disposed in parallel. In the present embodiment, when the computer case 200 is totally installed in the rack 300, the supporting part 154 is located at the end of the rail part 142 (shown as FIG. 3).

When the computer case 200 is pushed into the rack 300 from a front end thereof, the supporting part 154 contacts the bottom surface 142a of the rail part 142, and is slid along the bottom surface 142a. Therefore, when the computer case 200 is pulled out from the rack 300, since the supporting part 154 is interfered with the rail part 142, turnover of the computer case 200 due to excessive pulling out can be avoided. Namely, when the computer case 200 is moved, the gravity center thereof can be maintained unchanged based on the interference of the supporting part 154 and the rail part 142.

Moreover, in the present embodiment, the slide rail structure 100 further includes a blocking member 160 fixed to the first slide rail 110. The blocking member 160 is used for limiting movement of the computer case towards the interior of the rack. In detail, the blocking member 160 has at least a block part 162. When the computer case 200 moves towards the interior of the rack 300, the computer case 200 can only move to the position where the block part 162 located.

In summary, in the slide rail structure of the present invention, the carrying part of the second slide rail carries the computer case, and the computer case can be slid on the carrying part, so that assembling a slide rail on the computer case is unnecessary. Therefore, a space between the computer case and the rack, which is originally used for assembling the slide rail to the computer case can be saved. Thus, the slide rail structure of the present invention can be allocated to a space with a relatively small width. Moreover, in the slide rail structure of the present invention, the rail part of the third slide rail is interfered with the supporting member on the computer case. Therefore, turnover of the computer case can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A slide rail structure, disposed between a computer case and a rack, comprising:

a first slide rail, fixed to the rack; and a second slide rail, having a first end, a second end and a carrying part, wherein the second slide rail is fixed to the rack via the first end, and is connected to the first slide rail via the second end, and the carrying part contacts a bottom plate of the computer case for sliding the computer case on the carrying part;

a third slide rail, located in the second slide rail and fixed to the second slide rail, wherein the third slide rail has a rail part; and a supporting member, fixed to the computer case and slidably disposed on the rail part wherein the supporting member has a supporting part which slides underneath the rail part and above the carrying part and contacts the rail part; when the computer case is pushed into the rack from a front end thereof, the supporting part contacts a bottom surface of the rail part and is slid along the bottom surface, and when the computer case is pulled out from the rack, the supporting part is slid along the bottom surface of the rail part and is interfered with the rail part, so as to avoid turnover of the computer case.

2. The slide rail structure as claimed in claim 1, wherein the supporting member is located at a position rear to a gravity center of the computer case.

3. The slide rail structure as claimed in claim 1, wherein the supporting member is located at a rear end of the computer case.

4. The slide rail structure as claimed in claim 1, wherein the rail part is parallel to the carrying part.

5. The slide rail structure as claimed in claim 1, further comprising:

a holder, fixed to the rack and the first end of the second slide rail, so as to fix the second slide rail to the rack via the holder.

6. The slide rail structure as claimed in claim 1, further comprising:

a blocking member, fixed to the first slide rail, for limiting movement of the computer case towards an interior of the rack.

7. The slide rail structure as claimed in claim 1, further comprising:

a plurality of fixing members, wherein the first slide rail has a slide groove, and the fixing members are respectively penetrated through the slide groove and fixed to the second slide rail.

8. The slide rail structure as claimed in claim 1, wherein the second slide rail is slidably disposed in the first slide rail via the second end.

* * * * *